United States Patent
Shi et al.

(10) Patent No.: US 9,744,565 B2
(45) Date of Patent: Aug. 29, 2017

(54) SWING SPRAY DEVICE OF CLEANING APPARATUS AND CLEANING METHOD

(71) Applicant: BEIJING SEVENSTAR ELECTRONICS CO., LTD., Beijing (CN)

(72) Inventors: Yanhui Shi, Beijing (CN); Yi Wu, Beijing (CN)

(73) Assignee: BEIJING SEVENSTAR ELECTRONICS CO., LTD., Beijing (CN)

( * ) Notice: Subject to any disclaimer, the term of this patent is extended or adjusted under 35 U.S.C. 154(b) by 206 days.

(21) Appl. No.: 14/127,975

(22) PCT Filed: Apr. 1, 2013

(86) PCT No.: PCT/CN2013/073580
§ 371 (c)(1),
(2) Date: Dec. 20, 2013

(87) PCT Pub. No.: WO2014/089942
PCT Pub. Date: Jun. 19, 2014

(65) Prior Publication Data
US 2015/0209834 A1   Jul. 30, 2015

(30) Foreign Application Priority Data
Dec. 14, 2012   (CN) .......................... 2012 1 0546229

(51) Int. Cl.
*H01L 21/02*   (2006.01)
*B08B 3/02*    (2006.01)
(Continued)

(52) U.S. Cl.
CPC ........ *B08B 3/024* (2013.01); *H01L 21/67051* (2013.01); *B05B 13/0405* (2013.01); *B05B 15/04* (2013.01)

(58) Field of Classification Search
CPC ..... B05B 13/04; B05B 13/0404; B08B 3/024; B08B 3/02; H01L 21/67051
(Continued)

(56) References Cited

U.S. PATENT DOCUMENTS

| 5,608,943 A * | 3/1997 | Konishi ................. B08B 3/022 |
| | | 118/50 |
| 6,643,882 B1 * | 11/2003 | Sotozaki ................ B08B 1/007 |
| | | 15/102 |
| 2010/0130022 A1 * | 5/2010 | Park .................. H01L 21/67178 |
| | | 438/758 |

FOREIGN PATENT DOCUMENTS

CN   101459047 A   *   6/2009
CN   101797714 A   *   8/2010
(Continued)

OTHER PUBLICATIONS

Machine Design: Guideilnes for Selecting Pneumatic Cylinders. Sept 29, 2011. <http://machinedesign.com/pneumatics/guidelines-selecting-pneumatic-cylinders>.*

*Primary Examiner* — Katelyn Whatley
(74) *Attorney, Agent, or Firm* — Tianchen LLC

(57) ABSTRACT

The present invention relates to the field of semiconductor manufacturing technology, more particularly to a swing spray device of a cleaning apparatus and a cleaning method. The swing spray device comprises a spray arm, a spray head and a driving unit. The spray head is connected with the spray arm, and is controlled to swim by the driving unit. The spray head is hinged with the spray arm to form a first hinge joint. The driving unit is an air cylinder; the piston rod of the air cylinder is connected with the spray head. The piston rod is hinged with the spray head to form a second hinge joint. Therefore, the better cleaning effects can be achieved both in the center and the edge of the wafer.

4 Claims, 2 Drawing Sheets

(51) Int. Cl.
*H01L 21/67* (2006.01)
*B05B 13/04* (2006.01)
*B05B 15/04* (2006.01)

(58) Field of Classification Search
USPC .................................................. 134/34, 179
See application file for complete search history.

(56) References Cited

FOREIGN PATENT DOCUMENTS

CN 101850343 A * 10/2010
JP 2004363453 A * 12/2004

\* cited by examiner

SWING SPRAY DEVICE OF CLEANING APPARATUS AND CLEANING METHOD

CROSS-REFERENCE TO RELATED APPLICATION

This application claims the priority benefit of International Patent Application Serial No. PCT/CN2013/073,580, filed Apr. 1, 2013, which is related to and claims the priority benefit of China patent application serial no. 201210546229.6 filed Dec. 14, 2012. The entirety of each of the above-mentioned patent applications is hereby incorporated by reference herein and made parts of this specification.

FIELD OF THE INVENTION

The present invention relates to the field of semiconductor industry; more particularly to a swing spray device of a cleaning apparatus and a cleaning method using the swing spray device.

BACKGROUND OF THE INVENTION

Presently, in a wafer cleaning process, the wafer is rotated at a high speed and chemical liquids are vertically sprayed to the wafer surface from the spray head of a cleaning apparatus. Since the diameter of the wafer with copper interconnection formed thereon has increases to 300 mm, when the wafer rotates continuously in the cleaning process, the tangential velocity at the center of the wafer is significantly different from that at the edge of the wafer. As a result, when the chemical liquids vertically strike and collide with the wafer surface, different liquid backsplash may occur due to the different tangential velocities at the center and the edge of the wafer. The backsplash of the chemical liquid is larger at the wafer edge where the tangential velocity is higher. Therefore, even the spray head moves at a lower speed, the dissolving photoresist and residues in the grooves at the wafer edge are difficult to be removed. Consequently, there exists a need to solve the problem of the degradation of the cleaning effects caused by the big liquid backsplash occurred when the chemical liquids are sprayed at the edge of wafer surface.

SUMMARY OF THE INVENTION

Accordingly, at least one objective of the present invention is to provide a swing spray device of the cleaning apparatus and a cleaning method using the swing spray device for effectively cleaning the center and the edge of the wafer.

These and other objectives are met by the present invention, which in one aspect can be a swing spray device of the cleaning apparatus comprising a spray arm, a spray head and a driving unit. The spray head is connected with the spray arm, and is controlled to swing by the driving unit.

Preferably, the spray head is hinged with the spray arm to form a first hinge joint.

Preferably, the driving unit is an air cylinder, the piston rod of which is connected with the spray head.

Preferably, the piston rod is hinged with the spray head to form a second hinge joint.

Preferably, the swing spray device of the cleaning apparatus further comprises a protective sleeve in which the first hinge joint, the second hinge joint and the piston rod are placed.

Another aspect can be a cleaning method in accordance with the swing spray device of the cleaning apparatus mentioned above. The method comprises the following steps:

Step S1, rotating the slice object to be cleaned and moving the spray head to a position corresponding to the center of the slice object by the spray arm, followed by spraying out fluids from the spray head to clean the slice object, wherein the spray head is perpendicular to the slice object;

Step S2, swinging the spray head by the driving unit to spray out the liquids to the edge of the slice object, so as to complete the cleaning process of the slice object.

In the method mentioned above, the driving unit is an air cylinder comprising a piston rod connected with the spray head; the spray head is swung by pushing the piston rod out of the air cylinder through the action of compressed air so that the spray head is inclined to spray out the liquids to the edge of the slice object in the Step S2.

In the method mentioned above, the slice object is a wafer.

According to the present invention, the spray of the chemical liquids to the wafer surface is vertical when the spray head moves to a position corresponding to the center of the wafer and is inclined to the edge of the wafer when the spray head swings outward. The large spray impact to the center of the wafer can compensate the defectives of the lower tangential velocity so as to remove the small residue in the wafer surface grooves more easily. While since the tangential velocity at the edge of the wafer is higher, the inclined liquid spray to the peripheral wafer surface will not cause larger impact and backsplash so that the chemical liquids can flow into the deep grooves to wash away the residues therein. Therefore, the better cleaning effects can be achieved both in the center and the edge of the wafer.

BRIEF DESCRIPTION OF THE DRAWINGS

The swing spray device of the cleaning apparatus of the present invention will be elucidated by reference to the following embodiments and the accompanying drawings, in which.

DETAILED DESCRIPTION OF THE EMBODIMENTS

Figure 1:
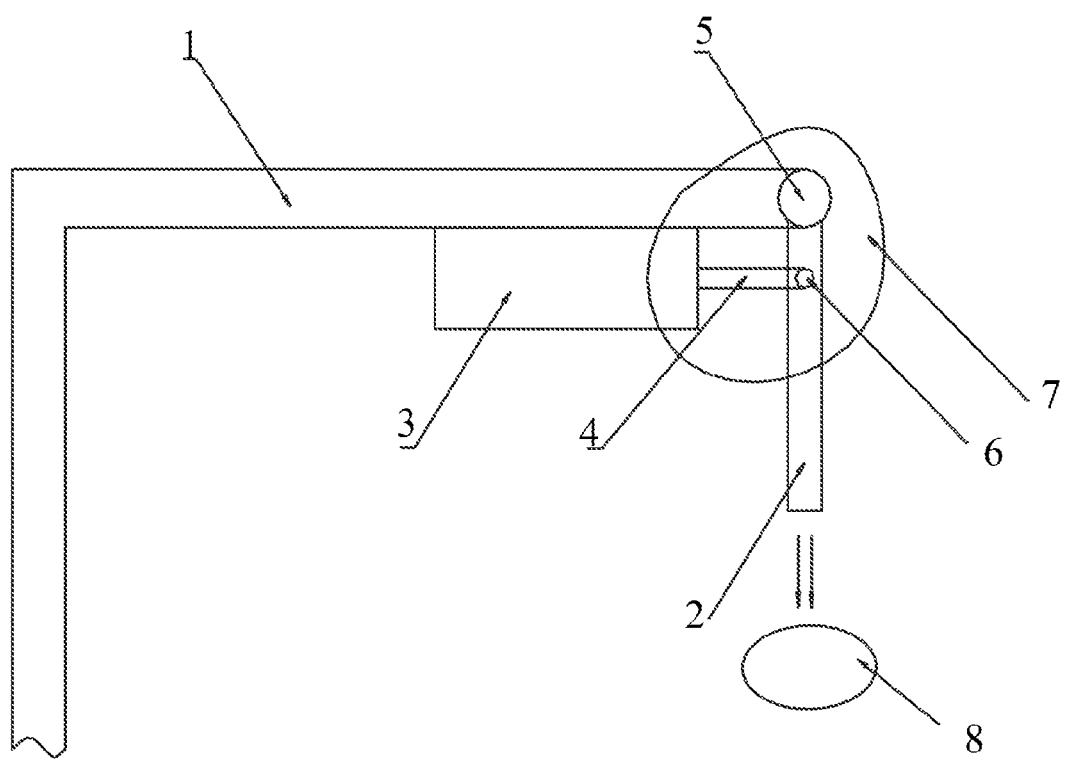
FIG. 1 is a schematic diagram of the swing spray device of the cleaning apparatus in an embodiment of the present invention.
Figure 2:
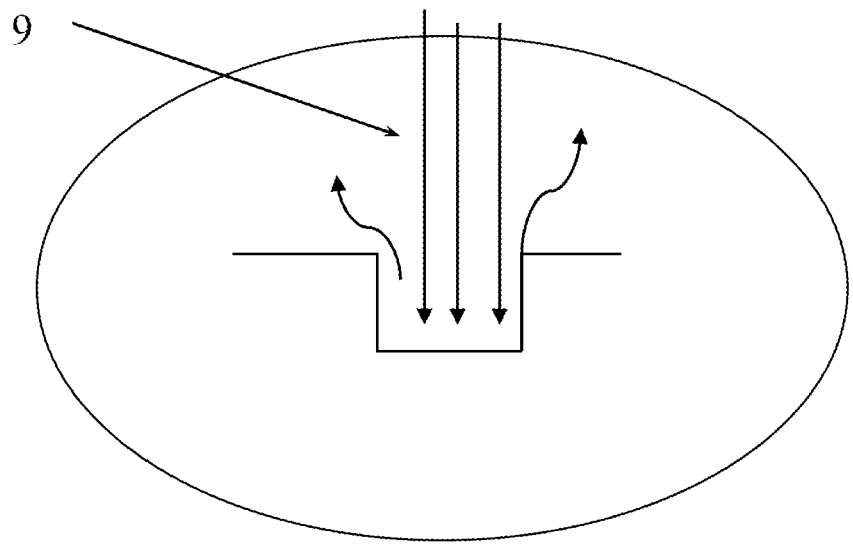
FIG. 2 is a schematic diagram showing the liquid backsplash at the center of the wafer.
Figure 3:
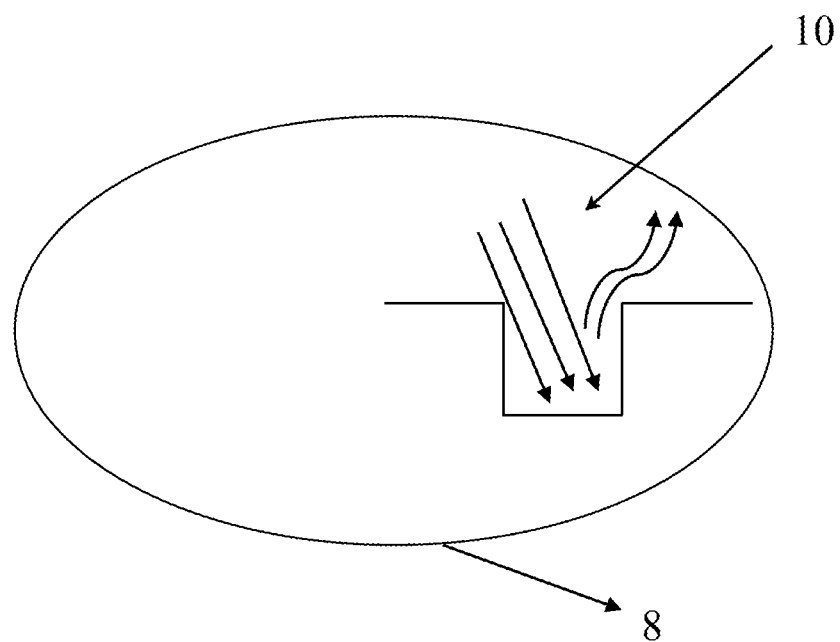
FIG. 3 is a schematic diagram showing the liquid backsplash at the edge of the wafer.

The swing spray device of the cleaning apparatus of the presently preferred embodiments are discussed in further details hereinafter with respect the embodiments and the accompanying drawings. However, the embodiments described herein are not the only applications or uses contemplated for the invention. The specific embodiments discussed are merely illustrative of specific ways to make and use the invention, and do not limit the scope of the invention or the appended claims.

For the description that follows, when the terms "center", "longitude", "lateral", "above", "below", "front", "back", "left", "right", "vertical", "horizontal", "top", "bottom", "inner", "outer" and similar terms are used herein, it should be understood that these terms have reference only to the structures shown in the drawings as it would appear to a person viewing the drawings and are utilized only to facilitate describing the invention. No limitation is intended or should be attached.

The terms "first", "second", "third" are merely used to describe the invention and do not indicate or suggest the relative importance.

The terms "mount", "connect", "communicate" are used in a broad sense unless otherwise indicated or limited to encompass any of a fixed connection, a detachable connection or an integral connection; a mechanical connection or an electrical connection; a direct connection, an indirect connection via intermediates or an inter connection between two components. Persons having ordinary skill in the art can fully understand the meaning of these terms in accordance with the specific conditions.

The term "multiple" refers to two or more than two unless otherwise indicated.

As shown in FIG. 1, the swing spray device of the cleaning apparatus comprises a spray arm 1, a spray head 2, and a driving unit. The spray head 2 is hinged with the spray arm 1 to form a first hinge joint 5. The spray head 2 is controlled to swing by the driving unit. The driving unit can be an air cylinder, a hydraulic cylinder, lead screws or gears, which can realize the swinging motion of the spray head 2.

In the embodiment, the driving unit is an air cylinder 3. The piston rod 4 of the air cylinder 3 is hinged with the spray head 2 to form a second hinge joint 6. The air cylinder 3 is connected with compressed air.

The swing spray device also comprises a protective sleeve 7 in which the first hinge joint 5, the second hinge joint 6, and the piston rod 4 are placed. As particles may easily generate due to the friction occurring between the surfaces at the first hinge join 5, the second hinge joint 6 and the piston rod 4 during the swinging motion of the spray head 2, the protective sleeve 7 housing the first hinge joint 5, the second hinge joint 6 and the piston rod 4 can prevent these particles falling into the wafer surface.

A cleaning method using the swing spray device is also provided in an embodiment of the present invention. The cleaning method comprises the following steps:

Step S1, rotating the wafer 8 and moving the spray head 2 to a position corresponding to the center of the wafer by the spray arm 1, followed by spraying out liquids from the spray head 2 to clean the wafer 8, wherein the spray head 2 is perpendicular to the wafer 8;

Step S2, swinging the spray head 2 by the driving unit to spray out the liquids to the edge of the wafer 8, so as to complete the cleaning process of the wafer 8. Specifically, the spray head 2 is swung by pushing the piston rod 4 out of the air cylinder 3 through the action of compressed air, so that the spray head 2 is inclined to spray out the liquids to the edge of the wafer 8, In the embodiment, the chemical liquids are sprayed out at an inclined angle to the edge surface of the wafer 8 so as to avoid causing large backsplash and further fill the deep grooves in the edge of the wafer 8, thus the photoresist and particles can be removed away from the wafer 8 surface with the inclined liquid spray. While in the center of the wafer 8 where the tangential velocity is low, on one hand, the liquid flow rate can be increased by the higher spray speed of the chemical liquids from the spray head 2; on the other hand, the vertical liquid spray to the wafer 8 surface at which the tangential velocity is almost zero can be conductive to clean the deep grooves. Due to the lack of the outward driving force for the liquid flow, the higher vertical spray impact to the surface around the center of the wafer 8 is more advantageous of cleaning the particles and photoresist. By using the swing spray device of the present invention, the liquid spray direction is changed so that the particles at the edge of the wafer 8 can be cleaned effectively.

The cleaning process will be described in details as follows.

Firstly, after the beginning of the cleaning process, the spray head 2 moves to a position corresponding to the center of the wafer 8 by the spray arm 1. The spray head 2 is perpendicular to the surface of the wafer 8 and sprays chemical liquids vertically to the wafer 8 surface. Then the spray head 2 swings outward by the piston rod 4 of the air cylinder 3, which makes the chemical liquids sprayed out at an angle to the wafer 8 surface and flow outward. The spray head 2 swings at a maximum angle when the chemical liquids are sprayed to the edge of the wafer 8. After the spray head 2 swinging outward for a wafer radius distance, it swings back to the position corresponding to the wafer 8 center by the air cylinder 3 and the direction thereof is gradually changed to be vertical. In the cleaning process, the angle of the liquid spray varies with the changing of the tangential velocity of the wafer 8. Accordingly, the chemical liquids are sprayed out at a maximum angle to the edge of the wafer 8 where the tangential velocity is higher, thereby causing small liquid backsplash on the edge wafer 8 surface, easy formation of bubbles, and outward flow of the chemical liquids, so that the dissolved photoresist and various particles in the wafer 8 surface grooves can be easily removed. Consequently, the better cleaning effects can be achieved both in the center and the edge of the wafer 8.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A cleaning method using a swing spray device of a cleaning apparatus for cleaning a slice object, wherein the swing spray device comprises a spray arm, a spray head which is hinged with an upper end of the spray arm to form a first hinge joint and an air cylinder, a piston rod of which is hinged with the spray head to form a second hinge joint at a position lower than the first hinge joint; the cleaning method comprising:

Step S1, rotating the slice object to be cleaned and moving the spray head to a position corresponding to the center of the slice object by the spray arm, followed by spraying out liquids from the spray head to clean the slice object, wherein the spray head is perpendicular to the slice object;

Step S2, swinging outward the spray head around the first hinge joint for a radius distance by pushing the piston rod of the air cylinder at the second hinge joint until liquids are sprayed out at a maximum angle to the edge of the slice object.

2. The cleaning method according to claim 1, wherein the slice object is a wafer.

3. The cleaning method according to claim 1, wherein the spray head is swung by pushing the piston rod out of the air cylinder through an action of compressed air so that the spray head is inclined to spray out the liquids to the edge of the slice object in the Step S2.

4. The cleaning method according to claim 1, wherein the swing spray device further comprises a protective sleeve in which the first hinge joint, the second hinge joint and the piston rod are placed.

\* \* \* \* \*